(12) United States Patent
Tenaglia et al.

(10) Patent No.: US 9,385,011 B2
(45) Date of Patent: Jul. 5, 2016

(54) APPARATUS FOR PROCESSING SEMICONDUCTOR WAFERS, IN PARTICULAR FOR CARRYING OUT A POLYMERS REMOVAL PROCESS STEP

(75) Inventors: Dario Tenaglia, Gravina di Catania (IT); Sebastiano Cali, Ramacca (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 880 days.

(21) Appl. No.: 13/440,852

(22) Filed: Apr. 5, 2012

(65) Prior Publication Data

US 2012/0260950 A1 Oct. 18, 2012

(30) Foreign Application Priority Data

Apr. 15, 2011 (IT) .................. MI2011A0646

(51) Int. Cl.
| | |
|---|---|
| B08B 7/04 | (2006.01) |
| B08B 3/08 | (2006.01) |
| B08B 5/00 | (2006.01) |
| B08B 3/02 | (2006.01) |
| H01L 21/67 | (2006.01) |
| B08B 3/10 | (2006.01) |
| H01L 21/02 | (2006.01) |
| H01L 21/306 | (2006.01) |
| H01L 21/677 | (2006.01) |

(52) U.S. Cl.
CPC ............ *H01L 21/67057* (2013.01); *B08B 3/02* (2013.01); *B08B 3/10* (2013.01); *H01L 21/02068* (2013.01); *H01L 21/30604* (2013.01); *H01L 21/67028* (2013.01); *H01L 21/67051* (2013.01); *H01L 21/67086* (2013.01); *H01L 21/67703* (2013.01)

(58) Field of Classification Search
CPC .............. H01L 21/67028; H01L 21/67086; H01L 21/67057; H01L 21/67703; H01L 21/30604; H01L 21/02068; H01L 21/67051; B08B 3/02; B08B 3/10
USPC .......................................... 134/902
See application file for complete search history.

(56) References Cited

U.S. PATENT DOCUMENTS

| | | | | |
|---|---|---|---|---|
| 4,899,768 | A | * | 2/1990 | Yatabe ........................ 134/66 |
| 4,974,619 | A | * | 12/1990 | Yu ................................ 134/76 |
| 5,030,057 | A | * | 7/1991 | Nishi ............... H01L 21/67294 118/500 |
| 5,131,799 | A | * | 7/1992 | Nishi ............... H01L 21/67294 414/416.09 |
| 5,253,663 | A | * | 10/1993 | Tanaka ............ H01L 21/67028 134/103.3 |
| 5,261,431 | A | * | 11/1993 | Ueno et al. ...................... 134/66 |
| 5,379,784 | A | * | 1/1995 | Nishi et al. .................. 134/102.3 |

(Continued)

FOREIGN PATENT DOCUMENTS

| | | |
|---|---|---|
| JP | 62291939 A | 12/1987 |
| JP | 04372129 A | 12/1992 |

(Continued)

*Primary Examiner* — Alexander Markoff
(74) *Attorney, Agent, or Firm* — Seed IP Law Group PLLC

(57) ABSTRACT

An apparatus for processing semiconductor wafers includes at least a wet bench and an automatic handling system of a wafer carrier removably connected thereto. The wet bench includes a first processing tank, a second processing tank and a third processing tank, separated from one another, each processing tank being dedicated to a different chemical, as well as a special cleaning and drying tank for processing the automatic handling system when the wafer carrier has been removed.

16 Claims, 5 Drawing Sheets

(56) References Cited

U.S. PATENT DOCUMENTS

| | | | | |
|---|---|---|---|---|
| 5,381,808 A * | 1/1995 | Kamikawa | | 134/61 |
| 5,431,179 A * | 7/1995 | Miyazaki et al. | | 134/61 |
| 6,099,686 A * | 8/2000 | Sugiuti | | 156/345.23 |
| 6,146,468 A * | 11/2000 | Dryer et al. | | 134/10 |
| 6,158,596 A * | 12/2000 | Ohtsuka et al. | | 211/41.18 |
| 6,318,382 B1 * | 11/2001 | Katagiri et al. | | 134/1.3 |
| 6,699,330 B1 * | 3/2004 | Muraoka | | 134/3 |
| 6,830,057 B2 * | 12/2004 | Dolechek | B08B 9/0861 | 134/148 |
| 6,904,920 B2 * | 6/2005 | Bexten | B08B 3/02 | 134/148 |
| 7,002,698 B2 * | 2/2006 | Hanson | H01L 21/67173 | 356/614 |
| 7,520,286 B2 * | 4/2009 | Davis | B08B 9/0826 | 134/153 |
| 7,578,304 B2 * | 8/2009 | Ohtsuka | | 134/95.2 |
| 2008/0078425 A1 * | 4/2008 | Hashimoto | | 134/26 |

FOREIGN PATENT DOCUMENTS

| | | |
|---|---|---|
| JP | 2007042691 A | 2/2007 |
| WO | 2007/077992 A1 | 7/2007 |

* cited by examiner

APPARATUS FOR PROCESSING SEMICONDUCTOR WAFERS, IN PARTICULAR FOR CARRYING OUT A POLYMERS REMOVAL PROCESS STEP

BACKGROUND

1. Technical Field

The present disclosure relates to an apparatus for processing semiconductor wafers.

The disclosure particularly, but not exclusively, relates to an apparatus for carrying out a polymers removal process step and the following description is made with reference to this field of application for convenience of explanation only.

2. Description of the Related Art

As it is well known, a wafer is a slice of semiconductor material, such as a silicon crystal, used in the manufacturing of integrated circuits and other microdevices. The wafer undergoes many manufacturing process steps such as doping or ion implantation, etching, deposition of various materials, and photolithographic patterning in order to realize several integrated circuit thereon. Finally the individual integrated circuits are separated, during a dicing step, and packaged.

Among the different manufacturing process steps, one of the most important is the step of removal of polymers from the wafer surface.

The polymer removal process steps is commonly performed after a dry metal etching step. The polymer removal process step is used in many technologies, such as the manufacturing processes for realizing devices using gold metallization, for instance DMOS, GaN HEMT transistors, and in the following reference will be made to these manufacturing process only for sake of illustration.

In particular, the polymer removal process step is carried out using a cleaning solvent. The most commonly used solvent to remove polymers is the one known with the commercial acronym of EKC265™, a highly selective, hydroxylamine-based solvent for post-etch residue removal.

When handling the EKC265™ solvent one should exercise particular precautions, since it may cause burns and allergic skin reactions during a prolonged skin contact. Moreover, an inhalation of EKC265™ solvent may cause respiratory tract irritation and a prolonged or repeated exposure may cause difficulty in breathing, headache, nausea, vomiting, drowsiness, cyanosis and lung damage.

During the polymer removal process steps of wafers, a wet bench is used, wherein the wafer is dipped in the EKC265™ solvent during a fully automated process step.

A well known apparatus used for the polymer removing process on a metal layer is the so called Solvent Spray Tool (SST), which is produced by SEMITOOL and is used in the post etch polymer residual removal process to clean the surface of wafers.

The SST apparatus comprises a process chamber with a rotor to support a wafer carrier. The polymer removal process is managed by software, the chemicals, among which the EKC265™ solvent, being introduced automatically by spray nozzles having a flow rate capability which ensures uniform coverage to both sides of the wafers.

More in particular, mechanical and centrifugal forces are applied to the wafers which rotate in a closed chamber, thus assisting and enhancing the reaction of chemicals on the wafer surface.

The SST apparatus realizes a closed loop process control, wherein chemicals are continuously recycled and filtered.

More in particular, the polymer removing process performed by the SST apparatus comprises the following steps in sequence:
spraying the wafers with EKC265™ solvent;
spraying the wafers with isopropyl alcohol (also propan-2-ol, 2-propanol or the abbreviation IPA); and
rinsing the wafers with de-ionized water (DIW).

In particular, the residue removal takes place where EKC265™ solvent is fed by means of suitable spray nozzles in a chamber wherein the wafers are housed, according to a pre-determined cycle of chemical re-circulation and wafer run. The re-circulation starts when the wafer run is over and the EKC265™ solvent is delivered to the chamber.

Then, isopropyl alcohol (IPA) is fed by the spray nozzles to the chamber. The isopropyl alcohol (IPA) is known to dissolve a wide range of non-polar compounds. Moreover, it is known that IPA is relatively non-toxic and evaporates quickly, being thus widely used as a solvent and as a cleaning fluid.

Finally, DIW is fed to the chamber for a rinse step of the wafers.

The polymer removal process performed by the SST apparatus also comprises a final step of blowing the wafers with nitrogen ($N_2$) for drying them.

The SST apparatus advantageously is a full automatic system, an operator intervention being used only for loading and unloading the wafer carrier and to change the drums containing the chemicals. Also, the SST system allows to dry the wafers.

However, it should be noted that in the SST apparatus the chemicals are introduced in a same chamber, not preventing phenomena of water infiltration, for instance due to a faulty valve.

It is remarked that water contamination in EKC265™ solvent may cause the corrosion of the metal layers of the integrated circuits of the wafers.

It should be also noted that the known SST apparatus is not able to process samples having different shape and size than silicon wafers for which the wafer carrier is sized. However, the treatment of differently sized and shaped semiconductor products could be desired, for instance in case of prototype samples.

BRIEF SUMMARY

One embodiment of the present disclosure provides a newly designed wafer processing apparatus for performing a polymer removal wet process with EKC265™ solvent and having structural and functional characteristics which allow to prevent any contamination between the used chemicals, while ensuring the maximum security level for operators health, in this way overcoming the limits which still affect the apparatuses realized according to the prior art.

BRIEF SUMMARY

The solution idea underlying the present disclosure is that of realizing a wafer processing apparatus, in particular to be used in a polymer removal wet process with EKC265™ solvent, which comprises different tanks being especially designed for performing process step involving different chemicals.

On the basis of such solution idea the technical problem is solved by an apparatus for processing semiconductor wafers of the type comprising at least a wet bench and an automatic handling system of a wafer carrier removably connected thereto, the wet bench comprising a first processing tank, a second processing tank and a third processing tank, separated one another, each processing tank being dedicated to a different chemical, as well as a special cleaning and drying tank for processing the automatic handling system when the wafer carrier has been removed.

More in particular, the disclosure comprises the following supplemental and optional features, taken alone or in combination when needed.

According to an aspect of the disclosure, the special cleaning and drying tank may be equipped with nozzles which provide a cleaning fluid and a drying blow.

According to this aspect of the disclosure, the nozzles of said special cleaning and drying tank may provide a flow of de-ionized water and a blow of nitrogen.

Moreover, according to an aspect of the disclosure, the first, second and third processing tanks may be provided with respective automatic lids, which automatically close and open said first, second and third processing tanks according to the different process steps being performed by the apparatus.

According to another aspect of the disclosure, the wet bench may further comprise a protective cover, which protects an operator of the apparatus, during the different processing steps, said protective cover being preferably at least partially transparent.

Furthermore, according to this aspect of the disclosure, the protective cover may be provided with an interlock which prevents any opening thereof during the working of the apparatus.

According to another aspect of the disclosure, the first processing tank may be filled with de-ionized water, the second processing tank may be filled with isopropyl alcohol and the third processing tank may be is filled with EKC265™ solvent, the apparatus carrying out a polymer removal process step.

According to another aspect of the disclosure, the wet bench may further comprise a separation bulkhead which isolates the third processing tank from the others.

Moreover, according to an aspect of the disclosure, the apparatus may further comprise a command panel, in turn comprising a touch screen, indicator lights and an emergency indicator, said control panel being used to check and program the working of the apparatus.

Also, according to an aspect of the disclosure, the first, second and third processing tanks may be provided with respective drains, for the chemicals comprised in each tank.

Also, according to another aspect of the disclosure, the first, second and third processing tanks may further comprise respective inlets, which receive the chemicals involved in the respective process steps carried out therein, as well as respective spray nozzles to fill the respective tank with the chemical.

According to an aspect of the disclosure, the first processing tank may directly receive at its inlets the de-ionized water.

Moreover, according to this aspect of the disclosure, the first processing tank may comprise a rinse up tank, preferably obtained in an hybrid version with a dump mechanism and an overflow mechanism in order to provide a rinse with de-ionized water of the semiconductor wafers.

According to an aspect of the disclosure, the apparatus may further comprise a first buffer tank in turn including a charge buffer tank for the charging of the isopropyl alcohol and a second discharge buffer tank for recovering the isopropyl alcohol, the first buffer tank being connected, through a first filtering group to the inlets and spray nozzles of the second processing tank.

Moreover, according to an aspect of the disclosure, the second processing tank may be provided with a recirculating mechanism having an overflow and spraying ramps using a pneumatic pump.

According to another aspect of the disclosure, the apparatus may further comprise a second buffer tank for the charge and discharge of the EKC265™ solvent, being connected, through a second filtering group to said inlets and spray nozzles of the third processing tank.

According to yet another aspect of the disclosure, the third processing tank may be provided with a recirculating mechanism having an overflow or a draught mechanisms and spraying ramps using a pneumatic pump.

According to this aspect of the disclosure, the second buffer tank may comprise an indirect heater, able to guarantee a desired processing temperature.

Moreover, according to an aspect of the disclosure, the first, second and third processing tanks may be made of stainless steel having been obtained by an electropolishing process in order to reduce its permeability to chemicals.

According to another aspect of the disclosure, the apparatus may further comprise fastening means able to removably anchor the wafer carrier to the automatic handling system, the wafer carrier sliding along a pair of tracks.

Alternatively, the apparatus may further comprises a support equipped with fastening means able to anchor the support to the automatic handling system, the wafer carrier sliding along a pair of tracks inside the support.

Finally, according to a further aspect of the disclosure, the third processing tank may be provided with an automatic chemicals distribution system, which handles containers comprising the chemical and provides for automatically charge it into the third processing tank.

The disclosure also relates to a wafer process sequence implemented by an apparatus realized according as previously indicated, comprising the following steps of:
uploading a wafer carrier;
dipping said wafer carrier into EKC265™ solvent contained in the first processing tank;
cleaning the wafers by using isopropyl alcohol contained in the second processing tank;
rinsing the wafers by using de-ionized water contained in the first processing tank;
downloading the wafer carrier; and
cleaning and drying the automatic handling system.

The characteristics and advantages of the apparatus according to the disclosure will be apparent from the following description of an embodiment thereof given by way of indicative and non-limiting example with reference to the annexed drawings.

DETAILED DESCRIPTION

Figure 1:
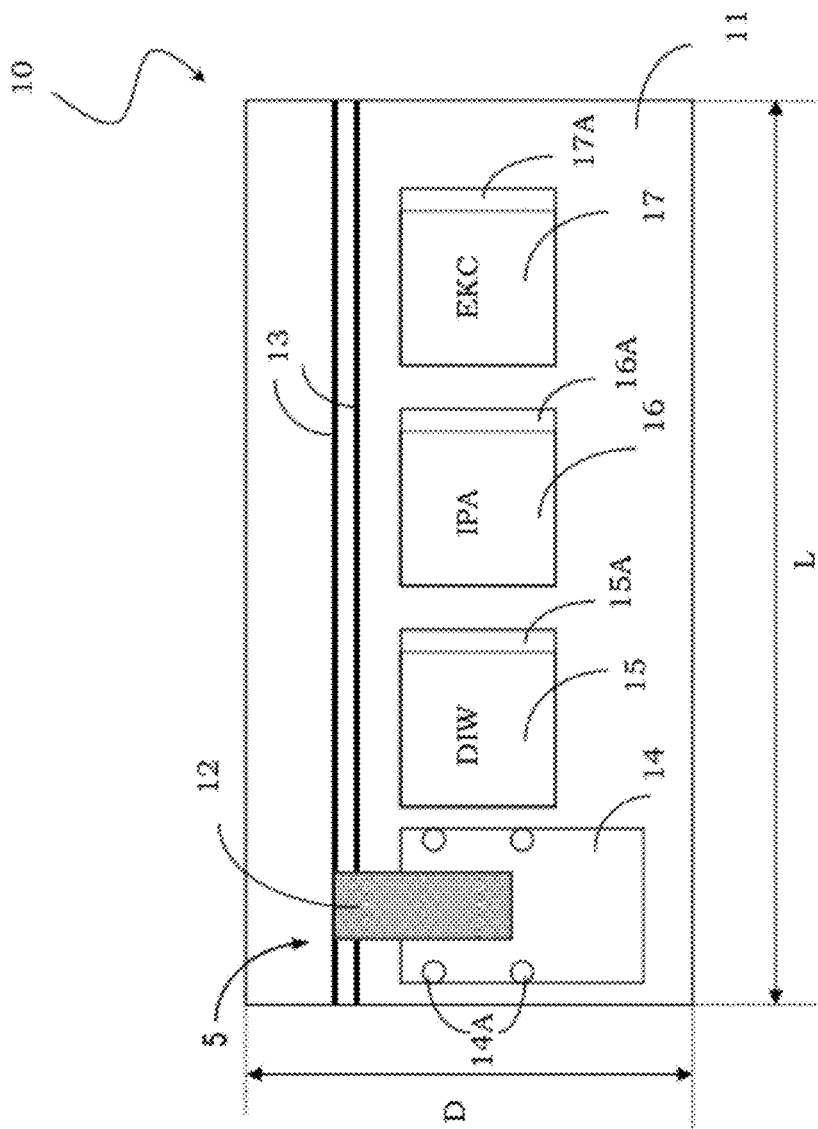
FIG. 1 schematically shows a top view an apparatus for processing wafers, in particular for carrying out a polymers removal process step, realized according to an embodiment of the disclosure.

With reference to such figures, and in particular to FIG. 1, an apparatus for processing wafers, in particular for carrying out a polymer removal process step is schematically shown, globally indicated with 10.

In the following description, numerous specific details are given to provide a thorough understanding of embodiments. The embodiments can be practiced without one or more of the specific details, or with other methods, components, materials, etc. In other instances, well-known structures, materials, or operations, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

Moreover, figures showing schematic views of the apparatus and its portions according to the embodiments of the disclosure are not drawn in scale, being on the contrary drafted so as to emphasize certain features of the disclosure.

As will be clear from the following description, the apparatus 10 is configured as a wet bench with at least three process tanks, in which the used chemicals are handled separately.

Moreover, the wet bench of the apparatus 10 is equipped with an automatic handling system 5 for supporting and conveying a wafer carrier. According to an aspect of the disclosure, the parts of the wafer carrier being in contact with the chemicals are washed and dried in a special compartment of the apparatus 10, in order prevent the occurrence of chemical contamination.

More in particular, the apparatus 10 comprises a wet bench 11 and the automatic handling system 5 which includes a removable connector 12 configured to releasably couple to and support a wafer carrier. The automatic handling system 5 includes a pair of tracks 13 on which the connector 12 slides and the wafer carrier is removably connected to the connector 12.

According to an aspect of the disclosure, the wet bench 11 comprises a special tank 14, in particular a washing and drying tank 14 equipped with nozzles 14A which provide a cleaning fluid, such as de-ionized water (DIW), and a drying blow, in particular of nitrogen $N_2$.

Moreover, according to an aspect of the disclosure, the wet bench 11 comprises a first processing tank 15, a second processing tank 16 and a third processing tank 17, separated one another.

More in particular, the first processing tank 15 is filled with de-ionized water (DIW) and is provided with a first lid 15A, the second processing tank 16 is filled with isopropyl alcohol (IPA) and is provided with a second lid 16A, and the third processing tank 17 is filled with EKC265™ solvent and is provided with a third lid 17A. According to an aspect of the disclosure, the first, second and third lids, 15A, 16A and 17A, are automatic lids. In particular, the lids 15A, 16A and 17A automatically close and open the processing tanks 15, 16 and 17 according to the different process steps being performed by the apparatus 10.

It should be remarked that the automatic handling system 5 moves the connector 12 and wafer carrier from one processing tank to another for performing a different process step.

Moreover, advantageously according to an aspect of the disclosure, the connector 12, after having released the wafer carrier, is inserted into the special tank 14, being subjected therein to a cleaning and drying step, in this way ensuring that no contamination between the chemicals of the different processing tanks, 15, 16 and 17, occurs when a process is started with a new lot of wafers housed into the wafer carrier.

Figure 2:
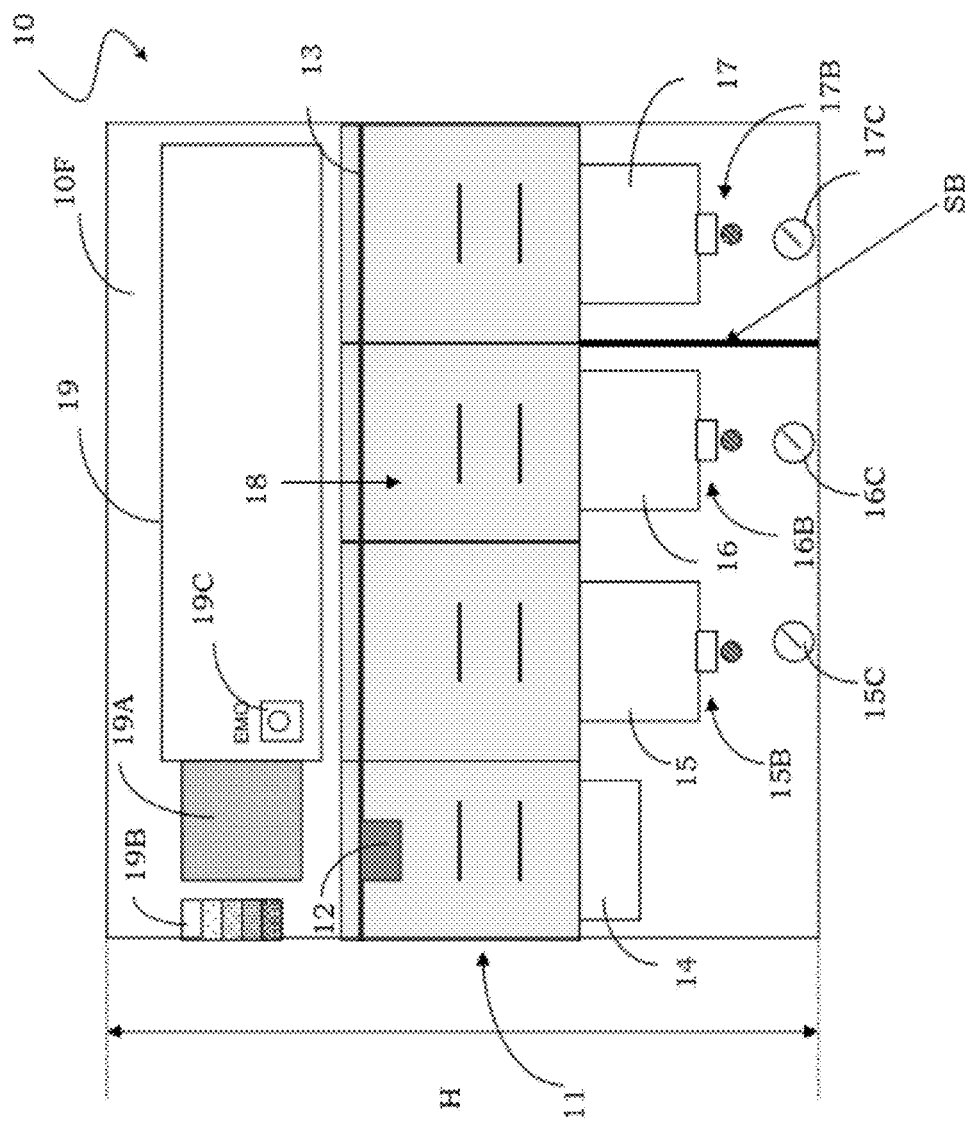
FIG. 2 schematically shows a front view of the apparatus of FIG. 1.

Advantageously according to another aspect the disclosure, as shown in FIG. 2, the wet bench 11 also comprises a separation bulkhead SB which isolates the third processing tank 17, i.e., the tank comprising EKC265™ solvent, from the others.

Moreover, as shown in FIG. 2, the wet bench 11 comprises a protective cover 18, being preferably at least partially transparent, which protects the operator of the apparatus 10, during the different processing steps. The protective cover 18 is provided with an interlock which prevents any opening thereof during the working of the apparatus 10 and in particular during the moving of the wafer by means of the automatic handling system 5.

Also, the apparatus 10 comprises, in its front side 10F, a command panel 19, which comprises, for instance, a touch screen 19A, indicator lights 19B and an emergency (EMO) indicator 19C. The control panel 19 is used to check and program the working of the apparatus 10.

As shown in FIG. 2, the first, second and third processing tanks, 15, 16 and 17, are provided with respective drains, 15B, 16B and 17B, connected to central pipes 15C, 16C and 17C for the chemicals in the tanks.

Figure 3:
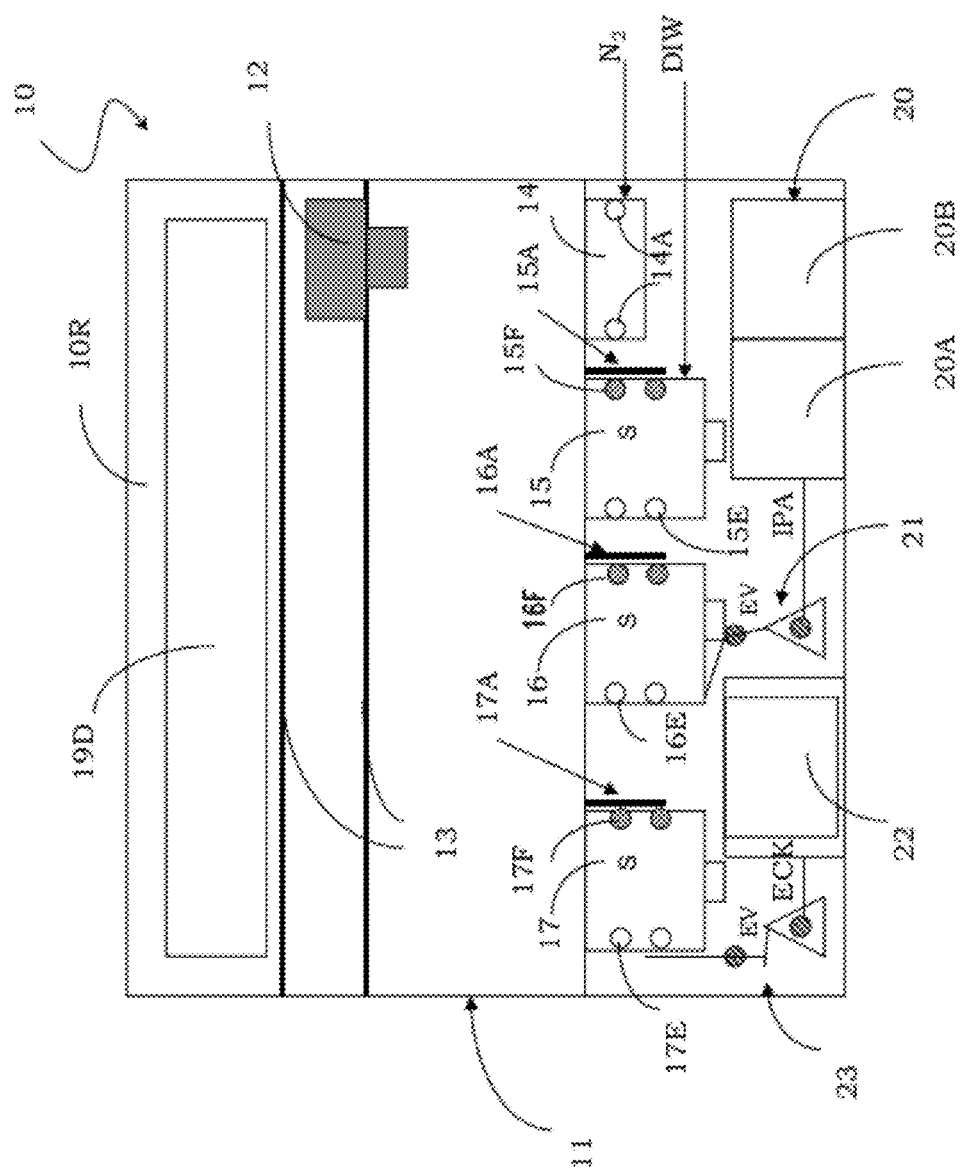
FIG. 3 schematically shows a rear view of the apparatus of FIG. 1.

Moreover, as shown in FIG. 3 wherein the rear side 10R of the apparatus 10 is illustrated, the first, second and third processing tanks, 15, 16 and 17, also comprises respective inlets, 15E, 16E and 17E, which received the chemicals involved in the respective process steps carried out therein, as well as respective spray nozzles, 15F, 16F and 17F to fill the respective tank with the chemical.

In particular, the first processing tank 15 directly receives at its inlets 15E the de-ionized water (DIW).

Moreover, the apparatus 10 comprises a first buffer tank 20 comprising a charge buffer tank 20A for supply the isopropyl alcohol (IPA) and a recovering buffer tank 20B for recovering the isopropyl alcohol (IPA), such a first buffer tank 20 being connected, through a first filtering group 21 to the inlets and spray nozzles, 16E and 16F, of the second processing tank 16.

Also, the apparatus 10 further comprises a second buffer tank 22 for the supply and recovery of the EKC265™ solvent, being connected, through a second filtering group 23 to the inlets and spray nozzles, 17E and 17F, of the third processing tank 17.

Also shown in FIG. 3 is a $N_2$ flow being provided to the nozzles 14A of the special tank 14.

More in particular, according to an embodiment of the disclosure, in order to carry out a polymer removal processing of semiconductor wafers, the first processing tank 15 is made of electropolished stainless steel in order to reduce its permeability to chemicals.

This first processing tank 15 is a rinse up tank, preferably obtained in an hybrid version with a dump mechanism and an overflow mechanism in order to provide a rinse with de-ionized water (DIW).

Moreover, the second processing tank 16 is also made of electropolished stainless steel.

According to a preferred embodiment of the disclosure, the second processing tank 16 is sized so as to accommodate a 6"wafer carrier, for example.

According to an aspect of the disclosure, the second processing tank 16 is provided with a recirculating mechanism having an overflow and spraying ramps using a pneumatic pump. In particular, the pneumatic pump is used to recirculate the fluid in a continuous manner, reducing the pulses as much as possible. The supplying of the chemical, in particular of the isopropyl alcohol (IPA), is performed by the first buffer tank 20, also comprising the charge buffer tank 20A and the recovering buffer tank 20B, made of electropolished stainless steel.

Moreover, the drain 16B is sized so as to guarantee the complete emptying of the second processing tank 16 and the possibility of supplying the chemical, in particular the isopropyl alcohol (IPA), either to the second discharge buffer tank 20B or to discharge it.

The first filtering group 21 comprises an housing of made of Perfluoroalkoxy or PFA.

Finally, the third processing tank 17 is still made of electropolished stainless steel.

According to the preferred embodiment of the disclosure, the third processing tank 17 is sized so as to house a 6"wafer carrier.

According to an aspect of the disclosure, the third processing tank 17 is provided with a recirculating mechanism with an overflow feature or a suction mechanism and spraying ramps using a pneumatic pump. In particular, the pneumatic pump is used to recirculate the fluid in a continuous manner, reducing the pulses as much as possible.

Moreover, the drain 17B is also sized so as to guarantee the complete emptying of the third processing tank 17 and the possibility of supplying the chemical, in particular the EKC265™ solvent, both to a recovering buffer tank or to discharge it. The supplying of the chemical is performed by the second buffer tank 22. Moreover, the second buffer tank 22 is equipped with an indirect heater, able to provide a desired processing temperature, for instance equal to 75° C.±1.

It should be noted, in fact, that the chemical, in particular the EKC265™ solvent, is provided from outside to the second buffer tank 22 and heated therein by the heater until the desired processing temperature is reached and only then provided to the third processing tank 17.

The second filtering group 23 comprises an housing of made in Perfluoroalkoxy or PFA.

It is remarked that the third processing tank 17 is separated from the first and second processing tanks, 15 and 16, by the separation bulkhead SB.

Moreover, the third processing tank 17 dedicated to the EKC265™ solvent is loaded automatically by an automatic chemical distribution system (or CDS), which handles containers comprising the chemical, in particular the EKC265™ solvent, and provides for automatically supplying it into the third processing tank 17.

Figure 4:
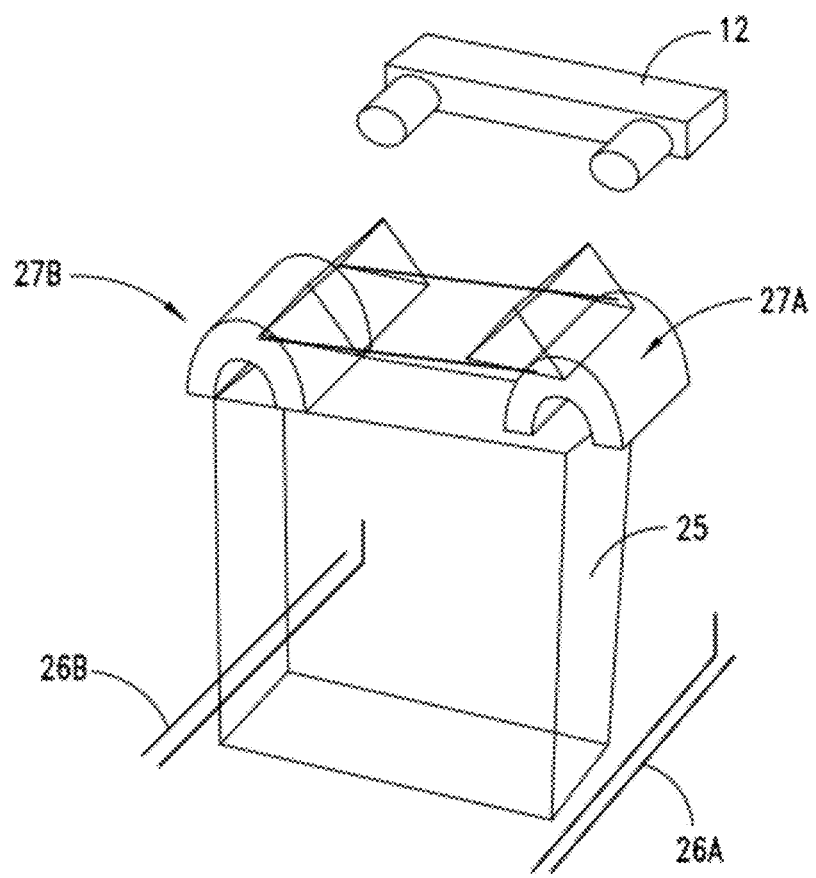
FIG. 4 schematically shows a 3D view of a first embodiment of an automatic handling system comprised in the apparatus of FIG. 1.
Figure 5:
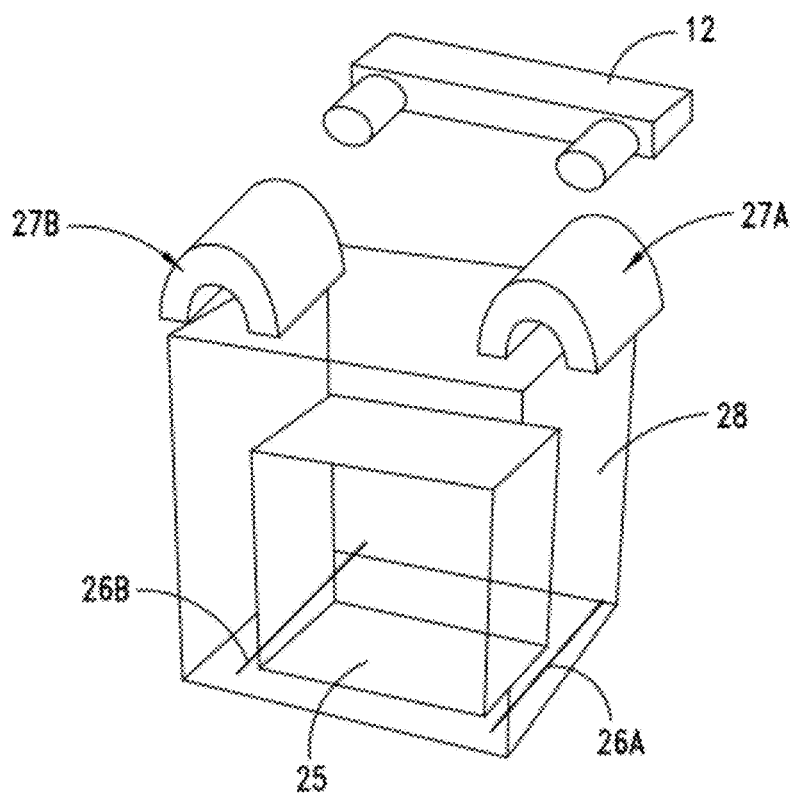
FIG. 5 schematically shows a 3D view of a second embodiment of an automatic handling system comprised in the apparatus of FIG. 1.

The apparatus 10 also comprises a wafer carrier 25 that is releasably connected to the connector 12 of the automatic handling system 5, as shown in FIGS. 4 and 5.

According to a first embodiment of the disclosure, as shown in FIG. 4, the wafer carrier 25 slides along a pair of tracks 26A and 26B. The apparatus 10 also comprises fasteners 27A and 27B able to removably anchor the wafer carrier 25 to the connector 12. In one embodiment, the fasteners 27A, 27B are fixed to the wafer carrier 25 and removably coupled to the connector 12, and in another embodiment, the fasteners 27A, 27B are fixed to the connector 12 and removably coupled to the wafer carrier 25.

In this case, the wafer carrier 25 is removed during the drying step, the fastener 27A and 27B being left tied to the connector 12. Obviously, the tanks and the lids are to be sized in order to duly take into account the heights of the wafer carrier 25 and the fasteners 27A and 27B. In this way, the wafer carrier 25 may be then sent to a drying station of the wafers, while the fasteners 27A and 27B are left tied to the connector 12 of the automatic handling system 5 during the rinse and drying steps of the portions having been in contact with the chemicals.

According to a second embodiment of the disclosure, as shown in FIG. 5, the wafer carrier 25 again slides along the pair of tracks 26A and 26B which are inside a support 28. The apparatus 10 also comprises the fasteners 27A and 27B, which able to anchor the support 28 to the connector 12.

In this case, the wafer carrier 25 is removed during the drying step, the support 28 and the fasteners 27A and 27B being left tied to the connector 12. Obviously, the tanks and the lids are to be sized in order to duly take into account the heights of the support 28 and the fasteners 27A and 27B. Also in this case, the wafer carrier 25 may be then sent to a drying station of the wafers, while the fasteners 27A and 27B and the support 28 are left tied to the connector 12 of the automatic handling system 5 during the rinse and drying steps of the portions having been in contact with the chemicals.

In summary, the apparatus 10 is configured as a wet bench 11 with three processing tanks, 15, 16 and 17, in which the used chemicals are handled separately.

All the processing tanks, 15, 16 an 17, are equipped with automatic lids, 15A, 16A and 17A.

The wet bench 11 is also equipped with an automatic handling system 5 configured to convey a wafer carrier 25, the parts thereof in contact with the chemicals being washed and dried in the special tank 14 so as to prevent the occurrence of chemical contamination.

The special tank 14 is also provided for cleaning and drying the connector 12 after the wafer carried has been removed therefrom.

In this way, the apparatus 10 ensures that no contamination between the chemicals of the different processing tanks occurs when its processing is started on a new lot of wafers housed into the wafer carrier.

The wafer carrier 25 is removably coupled to the connector 12 by the fasteners 27A and 27B and, in one embodiment, by a support 28 provided with the fasteners 27A and 27B.

The third processing tank 17 dedicated to the EKC265™ solvent is separated from the other tanks and is loaded automatically by the CDS.

The apparatus 10 is also provided with a protective cover 18 with interlock.

Finally, by using the apparatus 10, a process sequence is designed to prevent water from coming into contact with EKC265™ solvent. In particular, such a process sequence ensures that a wafer carrier is not loaded before the automatic handling system 12 has completed a cycle of washing and drying.

A typical process sequence implemented by the apparatus 10 comprises the following steps of:
    uploading the wafer carrier 25;
    dipping the wafer carrier 25 into EKC265™ solvent;
    cleaning the wafers using Isopropyl alcohol (IPA);
    rinsing up the wafers using De-Ionized Water (DIW);
    downloading the wafer carrier 25; and
    cleaning and drying the connector 12.

Advantageously, the chemicals are thus provided in the wet bench 11 within separate tanks and, thanks to the cleaning and drying of the connector 12, devoid of the wafer carrier 25, before the processing of a new lot of wafers is started, there is no danger of contamination.

The apparatus 10 offers greater versatility as it can be used both in automatic and manual mode. In particular, a manual mode which excludes the automatic loading mechanism of the apparatus 10 may be used in case of solvents to be tested, for instance, limited amounts of these solvents being provided manually.

It is also remarked that, using the apparatus 10, it is possible to process samples of different shapes and sizes.

Obviously, a technician of the field, aiming at meeting incidental and specific needs, will bring several modifications to the above described apparatus, all within the scope of protection of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus for processing semiconductor wafers, comprising:
   an automatic handling system including a connector coupled to a support, the support housing a wafer carrier carrying semiconductor wafers, the automatic handling system being configured to convey the support housing the wafer carrier;
   a wet bench including a first processing tank, a second processing tank and a third processing tank, separated from one another, and a cleaning and drying tank, the first, second, and third processing tanks being configured to store first, second, and third chemicals, respectively, for processing wafers in the wafer carrier, the cleaning and drying tank being configured to receive and process the connector and the support; and
   a pair of tracks positioned inside said support and configured to enable said wafer carrier to slide along the pair of tracks.

2. An apparatus according to claim 1, wherein said cleaning and drying tank is equipped with nozzles configured to provide a cleaning fluid and a drying blow.

3. An apparatus according to claim 2, wherein said nozzles of said cleaning and drying tank are configured to provide a flow of de-ionized water and a blow of nitrogen.

4. An apparatus according to claim 1, wherein said first, second and third processing tanks are provided with respective automatic lids configured to automatically close and open said first, second and third processing tanks during processing of the semiconductor wafers in the wafer carrier.

5. An apparatus according to claim 1, wherein said wet bench further comprises a protective cover, which protects an operator of the apparatus, during processing of the semiconductor wafers, said protective cover being preferably at least partially transparent.

6. An apparatus according to claim 5, wherein said protective cover is provided with an interlock which prevents any opening thereof during processing of the semiconductor wafers.

7. An apparatus according to claim 1, wherein said first processing tank is filled with de-ionized water, said second processing tank is filled with isopropyl alcohol, and said third processing tank is filled with a hydroxylamine-based solvent, the apparatus being configured to carry out a polymer removal process.

8. An apparatus according to claim 7, wherein said wet bench further comprises a separation bulkhead which isolates the third processing tank from the first and second processing tanks.

9. An apparatus according to claim 1, wherein said first, second and third processing tanks, are provided with respective drains for chemicals stored in the first, second and third processing tanks.

10. An apparatus according to claim 1, wherein said first, second and third processing tanks include respective inlets configured to receive the first, second, and third chemicals, respectively, and respective spray nozzles to fill the respective tank with the respective chemical.

11. An apparatus according to claim 10, further comprising:
    a first buffer tank that includes a charge buffer tank configured to charge the second processing tank with isopropyl alcohol and a discharge buffer tank configured to recover said isopropyl alcohol; and
    a first filtering group configured to couple said first buffer tank to said inlets and spray nozzles of said second processing tank.

12. An apparatus according to claim 11, wherein said the second processing tank includes a recirculating mechanism configured to recirculate the isopropyl alcohol.

13. An apparatus according to claim 11, further comprising:
    a second buffer tank configured to charge and discharge the third processing tank with a hydroxylamine-based solvent; and
    a second filtering group configured to couple said second buffer tank to said inlets and spray nozzles of said third processing tank.

14. An apparatus according to claim 13, wherein said second buffer tank comprises an indirect heater configured to heat the hydroxylamine-based solvent to a desired processing temperature.

15. An apparatus according to claim 1, wherein said first processing tank comprises a rinse tank with an overflow mechanism in order to rinse the semiconductor wafers with de-ionized water.

16. An apparatus according to claim 1, comprising an automatic chemical distribution system configured to handle containers of the third chemical and automatically charge the third chemical into said third processing tank.

\* \* \* \* \*